(12) United States Patent
Fernandez Reina et al.

(10) Patent No.: US 11,688,567 B2
(45) Date of Patent: Jun. 27, 2023

(54) WATERPROOF SWITCH ASSEMBLY

(71) Applicant: PREMO, SA, Campanillas (ES)

(72) Inventors: Juan Fernandez Reina, Campanillas (ES); Jose Antonio Jimenez Pavon, Campanillas (ES); Antonio Rojas Cuevas, Campanillas (ES); Francisco Ezequiel Navarro Perez, Campanillas (ES)

(73) Assignee: PREMO, SA, Campanillas (ES)

( * ) Notice: Subject to any disclaimer, the term of this patent is extended or adjusted under 35 U.S.C. 154(b) by 0 days.

(21) Appl. No.: 17/667,278

(22) Filed: Feb. 8, 2022

(65) Prior Publication Data

US 2022/0254581 A1    Aug. 11, 2022

(30) Foreign Application Priority Data

Feb. 9, 2021 (ES) .......................... ES202130248U

(51) Int. Cl.
| | | |
|---|---|---|
| *H01H 13/06* | (2006.01) | |
| *H01H 13/14* | (2006.01) | |
| *H05K 7/14* | (2006.01) | |

(52) U.S. Cl.
CPC ............ *H01H 13/06* (2013.01); *H01H 13/14* (2013.01); *H05K 7/1427* (2013.01)

(58) Field of Classification Search
CPC .. H01H 3/00; H01H 3/12; H01H 9/00; H01H 9/02; H01H 9/0242; H01H 9/04; H01H 9/041; H01H 2003/12; H01H 2009/02; H01H 2013/00; H01H 2013/04; H01H 2013/06; H01H 2013/02; H01H 2013/50; H01H 2013/52; H01H 2223/00; H01H 2223/002; H01H 2223/044; H01H 13/00; (Continued)

(56) References Cited

U.S. PATENT DOCUMENTS

| | | | | |
|---|---|---|---|---|
| 8,575,506 B2* | 11/2013 | Kitahara | ................ | H01H 13/06 200/341 |
| 9,520,253 B2* | 12/2016 | Gao | .................... | H01H 13/063 |
| 2011/0284351 A1 | 11/2011 | Kitahara | | |

FOREIGN PATENT DOCUMENTS

| | | |
|---|---|---|
| DE | 202016107304 U1 | 4/2018 |
| EP | 1032004 A2 | 8/2000 |
| WO | 2020212406 A1 | 10/2020 |

* cited by examiner

*Primary Examiner* — Anthony R Jimenez
(74) *Attorney, Agent, or Firm* — Lucas & Mercanti, LLP

(57) ABSTRACT

A waterproof switch assembly having a rigid casing with a first opening, a compressible elastomeric body attached to said casing around the first opening and defining a push button covering said first opening or attached to a push button covering said first opening, defining a hermetically sealed closed compartment within said casing; a Printed Circuit Board (PCB) housed inside the closed compartment and bearing a protruding electric switch component pushable by the push button; a protective frame, housed inside the closed compartment, surrounding the perimeter of the protruding electric switch component, and attached to the PCB through several connection legs distributed around the protruding electric switch component. The compressible elastomeric body includes protruding elements surrounding the protective frame to transmit shear forces, parallel to the PCB, from the push button to the PCB through the protective frame and connection legs without affecting the protruding electric switch component.

16 Claims, 2 Drawing Sheets

(58) Field of Classification Search
CPC ........ H01H 13/14; H01H 13/86; H01H 13/06; H01H 13/063; H01H 13/50; H01H 13/52; H01H 223/002; H01H 2223/04; H01H 2225/028; H01H 2227/024; H01H 2235/008; H01H 2235/01; H05K 7/142; H05K 7/14
USPC .......................................................... 200/341
See application file for complete search history.

WATERPROOF SWITCH ASSEMBLY

CROSS-REFERENCE TO RELATED APPLICATION

This application claims priority of Spanish Patent Application No. U 202130248, filed Feb. 9, 2021, which is incorporated herein by reference.

TECHNICAL FIELD

The present invention is directed towards a waterproof switch assembly, comprising a SMD switch installed in a PC board, that in addition to being resistant to environmental agents (humidity and temperature changes) presents an improved resistance against impacts and shear loads. The proposed waterproof switch assembly has been mainly conceived to be arranged inside a car door handle along with an antenna and a LED forming a bundle.

BACKGROUND OF THE INVENTION

Electronic push button switch assemblies mounted on a printed circuit board (PCB) to be installed or arranged on a door handle of a vehicle are known in the art. For example, International Patent Application WO2020212406-A1 of the same applicant of this utility model discloses a waterproof electric switch assembly comprising a closed compartment and an electric switch housed inside said closed compartment, the electric switch having connected thereto cables coming out of the compartment which is arranged inside a casing with a cavity with two openings, a first opening hermetically sealed by a compressible elastomeric body attached to said casing, and a second opening hermetically sealed by a cover. The elastomeric body extends into the cavity of the casing providing a surface supporting the electric switch and the cover has on its inner face a tubular wall which is inserted into the cavity of the casing and contacts the elastomeric body along the perimeter, the tubular wall completely surrounding the switch and assuring its waterproofness. The assembly also shows an external push button element.

The above-mentioned waterproof electric switch assembly, which can be connected to an antenna, solves the problems relating to the lack of water tightness of electronic products and eliminates the need of using a resin.

Other electric push button switch assemblies are also known by DE202016107304-U1, EP1032004-A2 and US2011284351-A1.

However, these types of electric switch assemblies installed in a door handle are critical in terms of mechanical robustness as they are easy to break (or to be detached from the PCB) due to external shear forces applied against the handle of a vehicle as a result of frictional impacts against a sidewall of the vehicle in narrow passages.

Likewise, during the assembly on the vehicle handle and also in its final installation (already in the car), the PCB-switch assembly can suffer undesired stresses transferred through the rubber of the external push button element. These stresses have been shown to cause the switch or the attachment thereof to the PCB to break.

Therefore, new reinforced electronic push button switch assemblies are needed.

BRIEF DESCRIPTION OF THE INVENTION

The present invention is directed towards a waterproof switch assembly, as described in the claims.

The waterproof switch assembly comprises, in a known manner in the state of the art:
a rigid casing with a first opening, a compressible elastomeric body attached to said casing around the first opening and defining a push button covering said first opening or attached to a push button covering said first opening, defining a hermetically sealed closed compartment within said rigid casing; and
a printed circuit board housed inside the closed compartment and bearing a protruding electric switch component by the push button in an axial direction perpendicular to the printed circuit board;

According to that, the compressible elastomeric body provides a waterproof sealing of the first opening of the rigid casing, defining a hermetically sealed closed compartment which contains the printed circuit board with the protruding electric switch component.

The compressible elastomeric body covers completely the first opening, acting as a push button, or is attached to a push button, preferably a rigid push button, permitting the movement of the push button in an axial direction perpendicular to the printed circuit board.

The protruding electric switch component faces the first opening, and an inner surface or protrusion of the push button, or of the compressible elastomeric body acting as a push button, faces the protruding electric switch component, producing its activation when the push button is pushed in the axial direction.

The present invention further proposes the following features not known from the state of the art documents in the field:
a protective frame, housed inside the closed compartment, closely surrounding the perimeter of the protruding electric switch component, and attached to the printed circuit board through several connection legs distributed around the protruding electric switch component;
wherein the compressible elastomeric body includes protruding elements surrounding the protective frame to transmit shear forces, parallel to the printed circuit board, from the push button to the printed circuit board through the protective frame without affecting the protruding electric switch component.

The protective frame is fitted around the protruding electric switch component, protecting the sides thereof from shear loads.

The protruding elements of the compressible elastomeric body surrounding the protective frame ensures that any shear load, parallel to the printed circuit board, suffered by the compressible elastomeric body of by the push button is transmitted to the protective frame, and also part of the axial loads when exceeding the normal pushing force.

The protective frame transmits the shear loads and the excessive axial loads to the printed circuit board through the connection legs, protecting the protruding electric switch component from said loads.

This is particularly beneficial when said waterproof switch assembly is installed in an exposed element, such a car door handle, which are very prone to suffer impacts producing shear loads on the waterproof switch assembly.

Other features of the present invention are also described in the accompanying claims.

It will be understood that references to geometric position, such as parallel, perpendicular, tangent, etc. allow deviations up to ±5° from the theoretical position defined by this nomenclature.

Other features of the invention appear from the following detailed description of an embodiment.

BRIEF DESCRIPTION OF THE FIGURES

The foregoing and other advantages and features will be more fully understood from the following detailed description of an embodiment with reference to the accompanying drawings, to be taken in an illustrative and non-limitative manner, in which.

DETAILED DESCRIPTION OF AN EMBODIMENT

Figure 1:
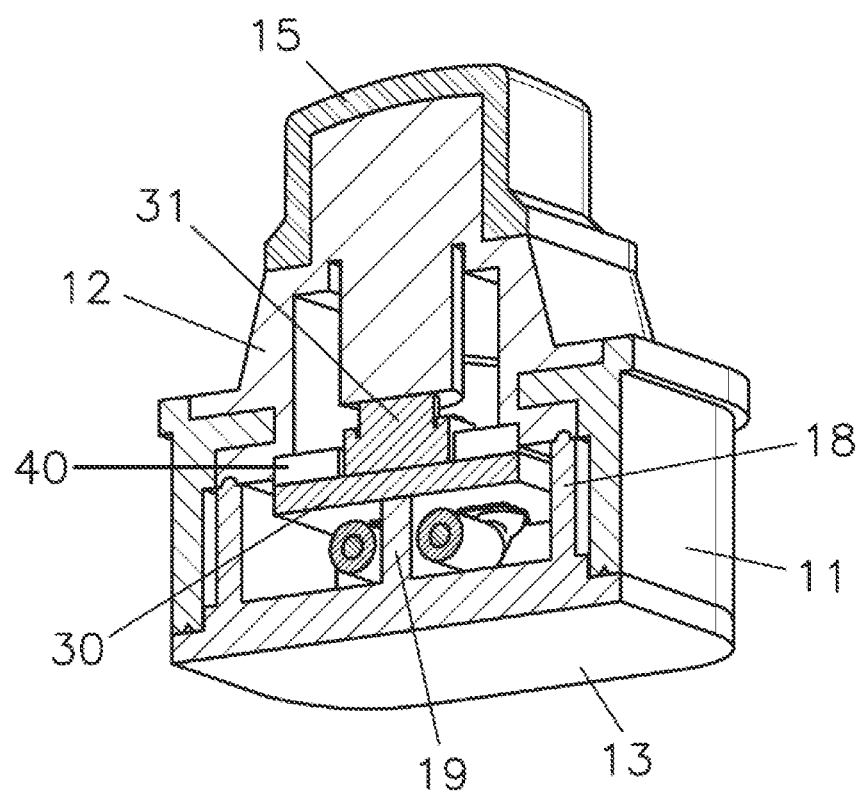
FIG. 1 shows a perspective view of a cross section of the proposed waterproof switch assembly according to a first embodiment.
Figure 2:
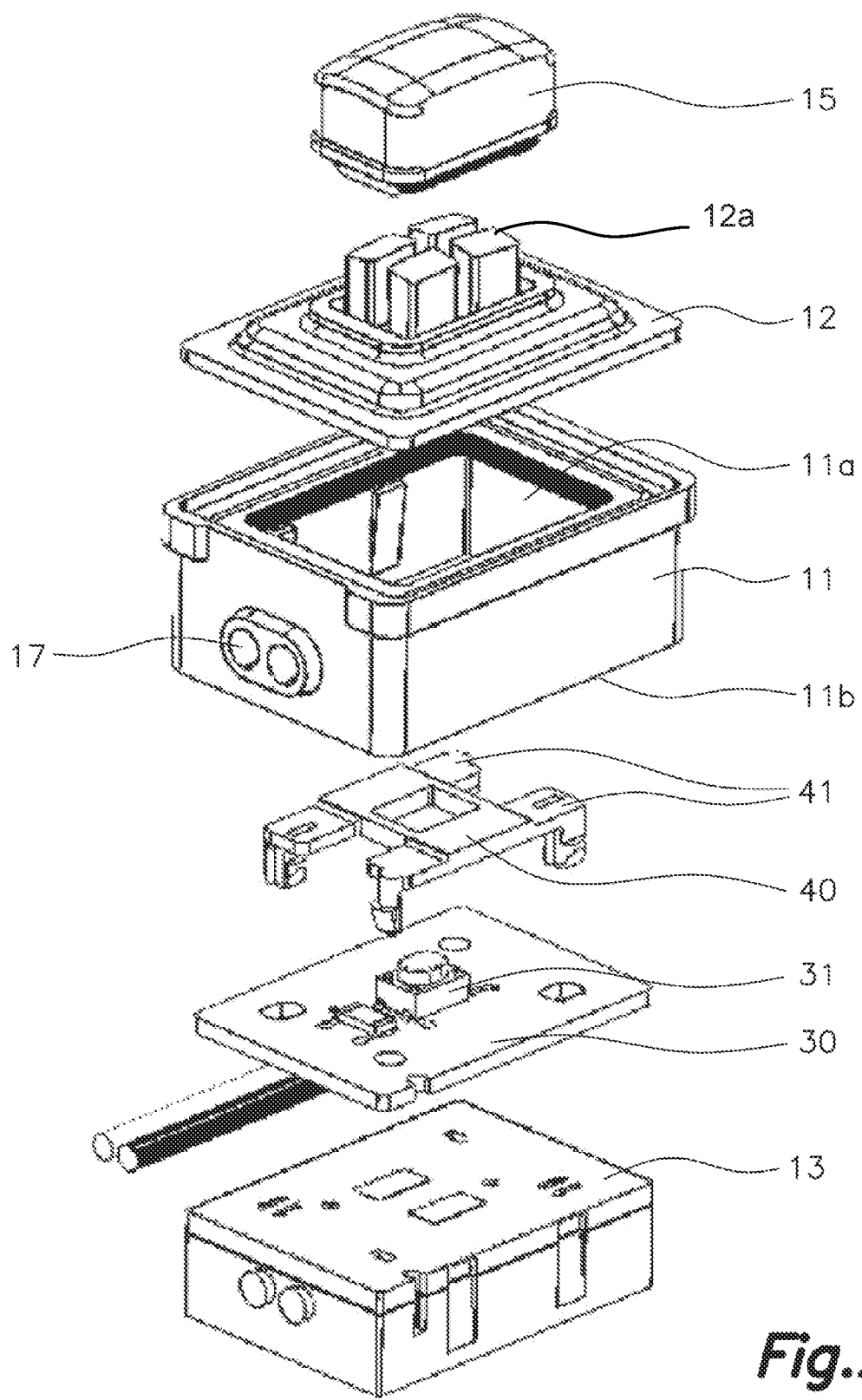
FIG. 2 shows a perspective exploded view of the proposed waterproof switch assembly according to a second embodiment.

The foregoing and other advantages and features will be more fully understood from the following detailed description of an embodiment with reference to the accompanying drawings, to be taken in an illustrative and not limitative.

The proposed waterproof switch assembly comprises, according to the preferred embodiment:
- a rigid casing 11 with a first opening 11a, a compressible elastomeric body 12 attached to said casing 11 around the first opening 11a and defining a push button covering said first opening 11a or attached to a push button covering said first opening 11a, defining a hermetically sealed closed compartment within said rigid casing 11;
- a printed circuit board 30 housed inside the closed compartment and bearing a protruding electric switch component 31 that can be activated by the push button in an axial direction perpendicular to the printed circuit board;
- a protective frame 40, housed inside the closed compartment, surrounding the perimeter of the protruding electric switch component, and attached to the printed circuit board through several connection legs 41 distributed around the protruding electric switch component;

wherein the compressible elastomeric body 12 includes protruding elements 12a surrounding the protective frame to transmit shear forces, parallel to the printed circuit board, from the push button to the printed circuit board through the protective frame without affecting the protruding electric switch component.

According to an additional embodiment, the connection legs will be preferably tightly inserted and/or snap-fitted into holes of the printed circuit board, providing an easy and strong connection between the protective frame and the printed circuit board.

Preferably the connection legs are symmetrically distributed around the protruding electric switch component. For example, they can be distributed radially around the protection frame, or can be symmetrically distributed on opposed sides thereof or symmetrically distributed in four quadrants around the protective frame, as shown in the attached drawings.

The protective frame can be a rectangular protective frame, but other shapes such a round protective frame, are also contemplated.

Preferably the connection legs are three or four connection legs.

The rigid casing 11 further includes a second opening 11b, opposed to the first opening 11a, covered by a cover 13, and wherein the cover 13 comprises on its inner face at least one tubular wall 18 inserted into the rigid casing 11 and establishes with a free edge thereof a perimetral interference contact with said surface of the elastomeric body assuring its waterproofness, this tubular wall 18 of the cover 13 completely surrounding the protective frame.

The cover 13 can be fixed to said casing, for example by means of an ultrasonic weld bead or by a mechanical fastening. Said mechanical fastening can be provided by side appendages of the cover 13 inserted into the cavity of the rigid casing 11, adjacent to two opposite inner walls of the rigid casing 11 and anchored inside openings 22 of said walls.

The printed circuit board is preferably connected to electric cables 16, which are exiting the hermetically sealed closed compartment through a hermetic seal.

Said hermetic seal through which the electric cables exit the hermetically sealed closed compartment can exit, for example, through a side window 17 of the casing 11 occupied by an extension 12c of the elastomeric body 12 and through which said insulated electrical conductors 16 pass, providing hermetic sealing to the side window 17.

Said elastomeric body 12 can further comprise a tubular wall 20 extending towards the outside of the cavity of the casing 11 until establishing a perimetral interference contact with the inner face of said closure cover 13 of the second opening 11b, said tubular wall 20 also surrounding the protruding electric switch component.

The mentioned cover 13 can further include on its inner face, in a central area, a projection 19 extending into the hermetically sealed cavity providing a support for said printed circuit board 30.

It is also proposed the elastomeric body 12 to be made of an elastomeric thermoplastic material operative in a temperature range of −85° C. to +85° C.

The elastomeric body 12 can be attached to the first opening 11a of the casing by overmoulding, comprising a flange placed against a part of the inner face of the casing surrounding said first opening 11a.

The elastomeric body 12 can be also attached to the push button, which is a rigid piece, by overmolding.

The elastomeric body 12 can further include stoppers which enter in contact with an exposed surface of the protection frame when the push button is pressed in the axial direction, transferring loads in the axial direction exceeding the pushing force required to activate the electric switch component to the protective frame.

The invention claimed is:

1. A waterproof switch assembly, comprising:
   a rigid casing with a first opening;
   a compressible elastomeric body attached to said rigid casing around the first opening, said compressible elastomeric body attached to a push button, and defining a hermetically sealed closed compartment within said rigid casing;
   a printed circuit board housed inside the closed compartment and bearing a protruding electric switch, said protruding electric switch activated by the push button and displaced in an axial direction perpendicular to the printed circuit board;
   a protective frame, housed inside the closed compartment, said protective frame comprising several connection legs and configured to be attached to the printed circuit board, surrounding a perimeter of the protruding switch, through said several connection legs,
   wherein the compressible elastomeric body includes one or more protruding elements that ensure that any load provided by the elastomeric body or by the push button is transmitted to the protective frame, which further transmits the load to the printed circuit board through the connection legs, protecting the protruding electric switch.

2. The waterproof switch assembly according to claim 1, wherein the connection legs are inserted and/or snap-fitted into holes of the printed circuit board.

3. The waterproof switch assembly according to claim 1, wherein the connection legs are symmetrically distributed around the protruding electric switch.

4. The waterproof switch assembly according to claim 1, wherein the protective frame is a rectangular protective frame.

5. The waterproof switch assembly according to claim 1, wherein the connection legs comprise three or four connection legs.

6. The waterproof switch assembly according to claim 1, wherein said compressible elastomeric body further comprises a tubular wall extending towards an outside of the cavity of the casing until establishing a perimetral interference contact with an inner face of a cover of the second opening, said tubular wall also surrounding the switch.

7. The waterproof switch assembly according to claim 1, wherein said compressible elastomeric body is made of an elastomeric thermoplastic material operative in a temperature range of −85° C. to +85° C.

8. The waterproof switch assembly according to claim 1, wherein the compressible elastomeric body is attached to the first opening of the rigid casing by overmolding, comprising a flange placed against a part of an inner face of the rigid casing surrounding said first opening.

9. The waterproof switch assembly according to claim 1, wherein the compressible elastomeric body is attached to the push button, which is a rigid piece, by overmolding.

10. The waterproof switch assembly according to claim 1, wherein the printed circuit board is connected to electric cables exiting the hermetically sealed closed compartment through a hermetic seal.

11. The waterproof switch assembly according to claim 10, wherein said hermetic seal comprises a side window of the rigid casing through which the electric cables exit the hermetically sealed closed compartment.

12. The waterproof switch assembly according to claim 1, wherein:
the rigid casing further includes a second opening, opposed to the first opening, covered by a cover, and
the cover comprises on its inner face at least one tubular wall that is inserted into the rigid casing and that establishes with a free edge thereof a perimetral interference contact with a surface of the compressible elastomeric body, the tubular wall of the cover completely surrounding the protective frame.

13. The waterproof switch assembly according to claim 12, wherein said cover is fixed to said rigid casing by means of an ultrasonic weld bead.

14. The waterproof switch assembly according to claim 12, wherein the cover has on its inner face, in a central area, a projection extending into the hermetically sealed cavity providing a support for said printed circuit board.

15. The waterproof switch assembly according to claim 12, wherein said cover is fixed to said rigid casing by a mechanical fastening.

16. The waterproof switch assembly according to claim 15, wherein said mechanical fastening is provided by side appendages of the cover which are inserted into the cavity of the rigid casing, adjacent to two opposite inner walls, and anchored inside openings of said walls.

* * * * *